United States Patent
Busson et al.

(10) Patent No.: US 6,914,304 B2
(45) Date of Patent: Jul. 5, 2005

(54) ELECTRONIC COMPONENT PROTECTED AGAINST ELECTROSTATIC DISCHARGES

(75) Inventors: Pierre Busson, Grenoble (FR);
Pierre-Olivier Jouffre, Grenoble (FR);
Bernard Louis-Gavet, Noyarey (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/867,285

(22) Filed: Jun. 14, 2004

(65) Prior Publication Data

US 2005/0024799 A1 Feb. 3, 2005

(30) Foreign Application Priority Data

Jun. 13, 2003 (FR) .............................. 03 07152

(51) Int. Cl.⁷ .............................................. H01L 23/62
(52) U.S. Cl. ...................................................... 257/355
(58) Field of Search ................................. 257/355–360

(56) References Cited

U.S. PATENT DOCUMENTS

| | | | |
|---|---|---|---|
| 4,855,863 A | 8/1989 | Yoshitake | |
| 5,646,434 A | 7/1997 | Chrysostomides et al. | |
| 5,721,658 A | 2/1998 | Ma et al. | |
| 6,002,568 A | 12/1999 | Ker et al. | |
| 6,362,497 B1 | 3/2002 | Hiraga | |

*Primary Examiner*—Cuong Nguyen
(74) *Attorney, Agent, or Firm*—Lisa K. Jorgenson; Jose Gutman; Fleit, Kain, Gibbons, Gutman, Bongini & Bianco P.L.

(57) ABSTRACT

The electronic component, comprises an integrated circuit incorporating several separate functional blocks within a semiconductor substrate, and electrostatic discharge protection means. These electrostatic discharge protection means comprise several separate metal discharge rails (GNDi) placed above the substrate (SB) and respectively associated with the plurality of functional blocks (CRi), all these metal discharge rails being mutually unconnected electrically within the integrated circuit (CI) but connected electrically via an electrical connection (FLi) external to the integrated circuit to one and the same ground plane (SLG) forming a ground reference for the electrostatic discharges, this ground plane (SLG) being located outside the integrated circuit (CI), and possibly being a heat slug.

18 Claims, 3 Drawing Sheets

ELECTRONIC COMPONENT PROTECTED AGAINST ELECTROSTATIC DISCHARGES

CROSS-REFERENCE TO RELATED APPLICATION

This application is based upon and claims priority from prior French Patent Application No. 03 07152, filed on Jun. 13, 2003, the entire disclosure of which is herein incorporated by reference.

BACKGROUND OF THE INVENTION

1. Field of the Invention

The invention relates to integrated circuits, and more particularly to radiofrequency integrated circuits intended to operate at frequencies greater than or equal to 1 GHz.

2. Description of the Related Art

At the present time, radiofrequency integrated circuits incorporate, within the same substrate, various separate, analog or digital, functional blocks such as, for example, LNAs (low-noise amplifiers), local oscillators, power amplifiers, digital demodulators or even phase-locked loops.

However, the production of integrated circuits is constrained by the need to equip them with electrostatic discharge protection means that protect them from the electrostatic discharges that could damage the electronic components of the integrated circuit.

Conventionally, these electrostatic discharge protection means comprise, in addition to the diodes and conventional protection circuits better known as clamps, several discharge (or metallization) rails respectively connected to the various functional blocks and forming a ground reference for the electrostatic discharges. To ensure continuous electrical continuity between these various discharge rails, provision is made in particular to place back-to-back diodes between the said rails.

However, such a construction induces coupling capacitances between the discharge rails, and consequently potential noise transmission between these rails.

Now, the transmission of noise may hamper, in particular in the radio frequency field, certain particularly sensitive functional blocks such as low-noise amplifiers.

Accordingly, there exists a need for overcoming the disadvantages of the prior art as discussed above.

SUMMARY OF THE INVENTION

The invention aims to provide a solution to this problem.

It is an object of the invention to propose an effective means of protecting the electronic component from electrostatic discharges, while minimizing potential noise transmission via these electrostatic discharge protection means.

The invention therefore proposes an electronic component comprising an integrated circuit incorporating several separate functional blocks within a semiconductor substrate, and electrostatic discharge protection means.

According to a general feature of the invention, the electrostatic discharge protection means comprise several separate metal discharge rails placed above the substrate and respectively associated with the plurality of functional blocks, all these metal discharge rails being mutually unconnected electrically within the integrated circuit but connected electrically via an electrical connection external to the integrated circuit to one and the same ground plane forming a ground reference for the electrostatic discharges, this ground plane being located outside the integrated circuit.

In other words, the invention provides a complete inter-rail brake within the integrated circuit and consequently there is isolation between the metal rails. However, the DC electrical continuity needed for electrostatic discharge protection is provided by this electrical connection external to the integrated circuit and by the external ground plane.

The invention is also noteworthy in the sense that, although the integrated circuit in itself is not protected against electrostatic discharges, this protection is acquired once the integrated circuit is coupled to the ground plane external to the integrated circuit.

Advantageously, the ground plane is a metal plate having one face visible when the integrated circuit is encapsulated in its package.

Thus, although the integrated circuit, that is to say for example the silicon chip, is not intrinsically protected against electrostatic discharges, this protection is acquired after the integrated circuit has been encapsulated in its package, that is to say after packaging. Thus, the electronic component, comprising the integrated circuit encapsulated in its package and the metal plate having one face located on the outside of the package, is intrinsically protected against electrostatic discharges.

The external metal connection between the discharge rails and the external ground plane may be produced, for example, by bonding wires connected, on the one hand, to the various metal discharge rails via contact pads and, on the other hand, to the external ground plane.

The presence of such bonding wires, which are generally inductive, helps to minimize noise transmission as they carry out a first filtering operation.

Moreover, the metal plate forming the said external ground plane may be a heat slug placed beneath the integrated circuit. A heat slug is a relatively thick metal plate. The separate metal discharge rails are then connected to the heat slug via separate electrical wires.

Thus, according to this embodiment, a standard means, namely the heat slug, used for other functions, in this case for dissipating heat, is used to form the external ground plane.

Moreover, a heat slug generally has low impedance and thus forms a cold spot, that is to say a path of minimum impedance, allowing in particular the charges to be discharged via this means.

For radiofrequency applications in particular, the integrated circuit may be advantageously fixed to a thin metal plate that acts as a ground reference for the radiofrequency signals. This thin metal plate is also called an "exposed pad" by those skilled in the art. When an integrated circuit is coupled to a heat slug, the heat slug is fixed beneath the said exposed pad.

By doing this, when there is no heat slug, the metal plate forming the said external ground plane acting as ground reference for the electrostatic discharges may consist of the said exposed pad acting as ground reference for the radiofrequency signals.

Thus, once again, a means normally used for other functions is used to form the external ground plane.

BRIEF DESCRIPTION OF THE DRAWINGS

Other advantages and features of the invention will become apparent on examining the detailed description of an entirely non-limiting embodiment, together with the appended drawings in which.

DETAILED DESCRIPTION

Figure 1:
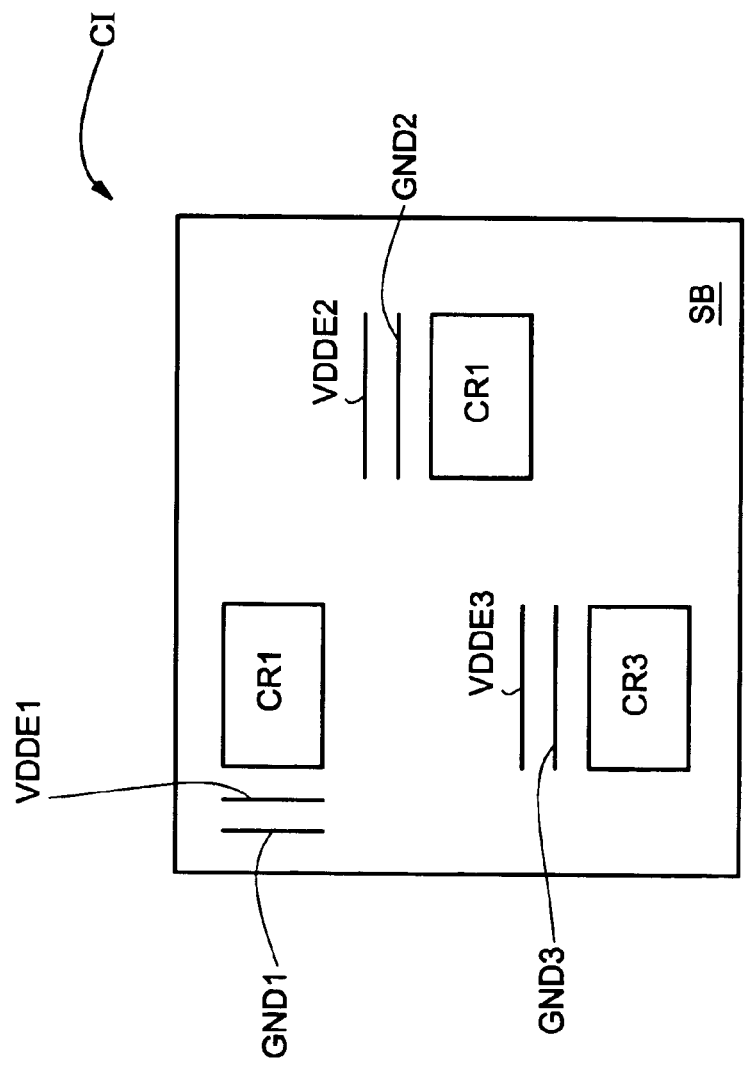
FIGS. 1 to 3 illustrate schematically one embodiment of an electronic component according to the invention.

In FIG. 1, the reference CI denotes an integrated circuit after it has been cut from a semiconductor wafer along lines of cutting.

This integrated circuit is produced within a semiconductor substrate SB.

For the sake of simplification, it will be assumed here that the integrated circuit comprises three separate functional blocks (or cores) CR1, CR2 and CR3. For example, the block CR1 may perform a low-noise amplification (LNA) function, whereas the block CR2 may perform a power amplification function and the block CR3 may perform a digital function.

This substrate SB is, in a radiofrequency application, a highly resistive substrate, which results in better high-frequency noise rejection performance. However, it turns out that such a highly resistive substrate is difficult to make compatible with a high level of electrostatic discharge protection, such as that provided in the prior art.

The invention solves this problem, especially by using electrostatic discharge protection means comprising several separate metal discharge rails placed above the substrate SB and respectively coupled to the plurality of functional blocks CR1–CR3.

Figure 2:
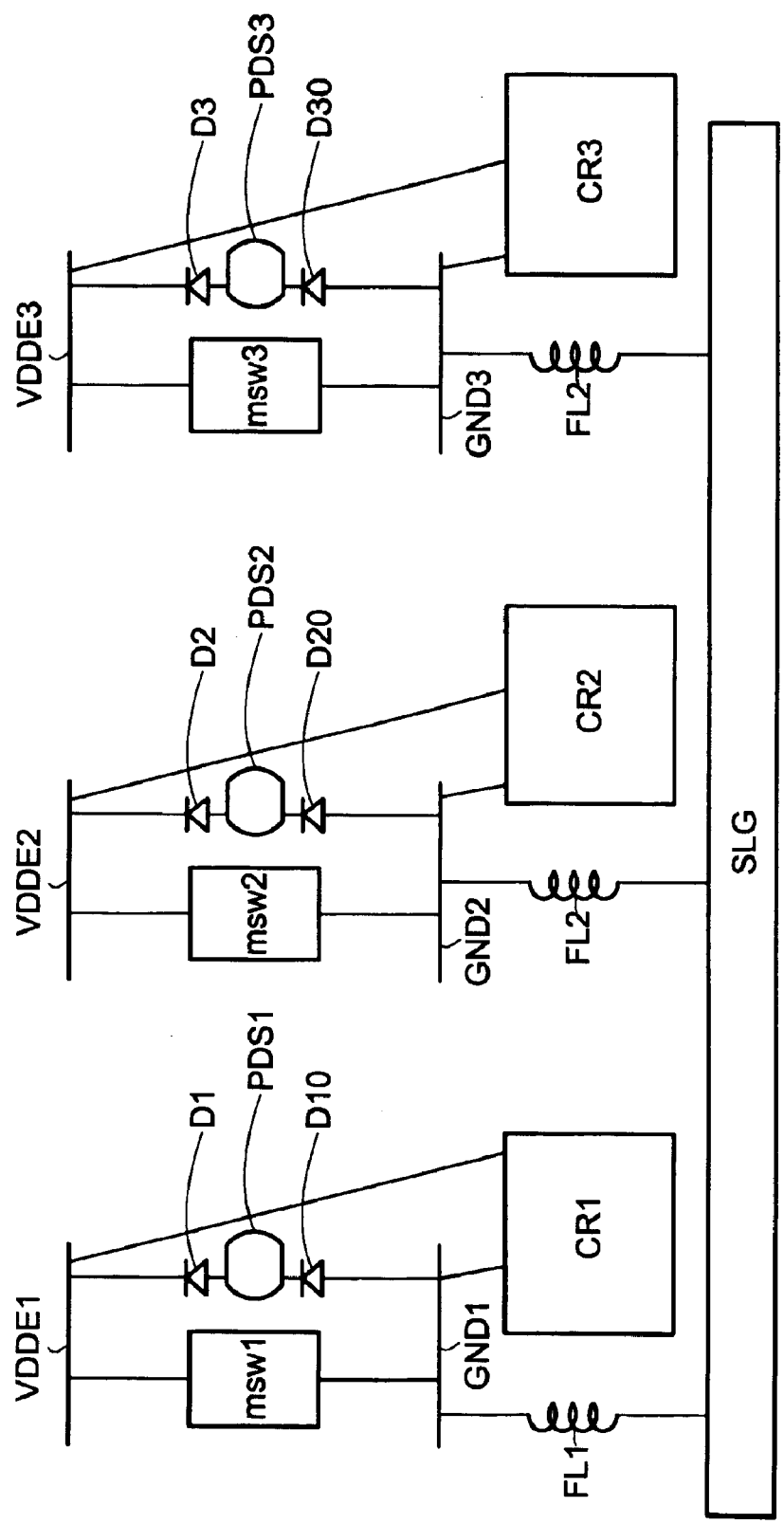

More precisely, in the example described here, as illustrated in FIG. 1, but also in greater detail in FIG. 2, a first metal rail GNDi and a second metal rail VDDEi are provided for each functional block CRi.

Each of these rails GDNi and VDDEi may be used specifically for electrostatic discharge protection. This being the case, they may also be used both for electrostatic discharge protection and as supply rail (VDDEi rail) and ground reference (GNDi rail) for each functional block CRi. It is for this reason that FIG. 2 shows two connections connecting the functional block CRi, to the GNDi rail and VDDEi rail respectively.

Moreover, the reference PDSi denotes a contact pad connected to the functional block CRi, for example via metal interconnection holes or vias in the substrate, and through which contact pad signals coming from the functional block CRi, or going to the functional block CRi, travel.

The signal pad PDSi is connected to the rails VDDEi via a diode Di (the cathode of this diode being connected to the corresponding rail VDDEi).

Moreover, the pad PDSi is connected to the corresponding rail GNDi via another diode Di0, the cathode of this diode Di being this time connected to the pad PDSi.

The diodes Di and Di0 usually form part, in a manner known per se, of electrostatic discharge protection means.

The electrostatic discharge protection means also include, for each pair of metal rails GNDi, VDDEi, a circuit mswi, known per se, conventionally composed for example of diodes and bipolar transistors, and intended to detect electrostatic discharge pulses and to allow passage from one rail to another. This circuit mswi is also better known as a clamp.

As illustrated in FIG. 2, each metal rail GNDi is electrically isolated from the other metal rails GNDj within the same integrated circuit CI.

However, it is necessary to provide electrical connection in terms of DC current between these various separate metal rails GNDi.

This is why, in the example illustrated in FIG. 2, each metal rail GNDi is connected to a ground plane located outside the integrated circuit and formed in this case by a heat slug SLG. Furthermore, the electrical connection of a rail GNDi is provided in this example by a bonding wire FLi.

Figure 3:
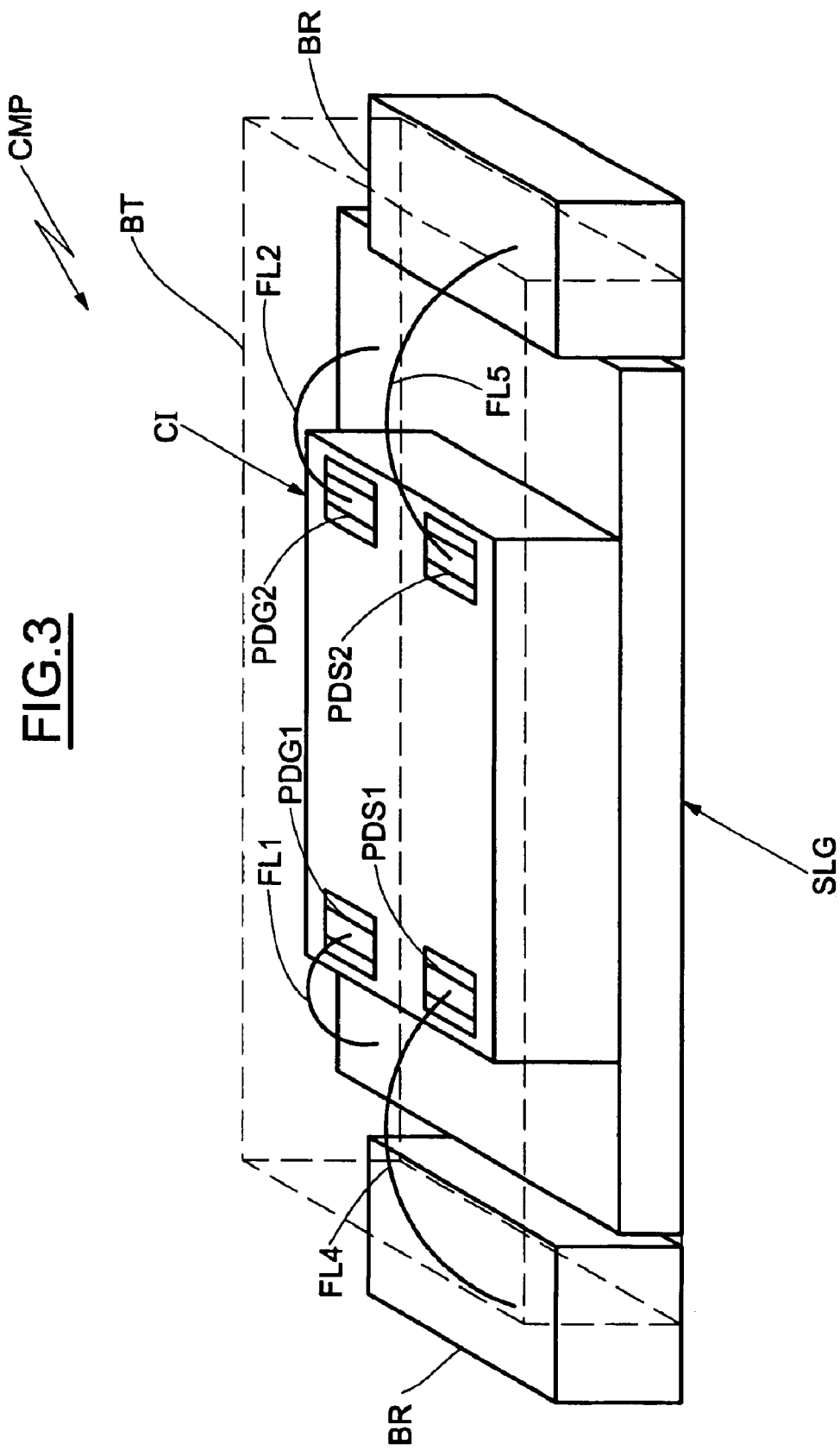

This is also illustrated in FIG. 3, in which the component CMP comprising the integrated circuit Cl with certain of its contact pads is shown, very schematically, encapsulated in its package BT.

The slug SLG is fixed beneath the integrated circuit CI, for example in particular in radiofrequency applications, by means of an exposed pad (not shown for the sake of simplification) integral with the rear face of the integrated circuit and acting as radiofrequency ground reference.

The lower face of the heat slug, located outside the package, is intended to be fixed to an electronic card.

This heat slug does not necessarily have to be connected to an external ground located on the electronic card in order to protect against electrostatic discharges. This being the case, it may be connected to an external ground located on the electronic card when the discharge rails GNDi are also used as electrical ground reference for the operation of the functional blocks CRi.

For the sake of simplification in FIG. 3, only the signal pads PDS1 and PDS2 connected to the pins BR of the package containing the integrated circuit CI via connecting wires FL4 and FL5 have been shown.

Moreover, connecting wires FL1 and FL2 provide, respectively, the external electrical connection between the heat slug SLG and contact pads PDG1 and PDG2, connected to the metal rails GND1 and GND2 respectively.

While there has been illustrated and described what is presently considered to be a preferred embodiment of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiment disclosed, but that the invention include all embodiments falling within the scope of the appended claims.

What is claimed is:

1. An electronic component, comprising:
    an integrated circuit incorporating several separate functional blocks within a semiconductor substrate; and
    electrostatic discharge protection means, comprising:
        several separate metal discharge rails placed above the substrate and respectively associated with the plurality of functional blocks, all the metal discharge rails being mutually unconnected electrically within the integrated circuit but connected electrically via an electrical connection external to the integrated circuit to one and the same ground plane forming a ground reference for electrostatic discharges, the ground plane being located outside the integrated circuit.

2. The electronic component according to claim 1, including separate bonding wires between the integrated circuit and the ground plane, which wires provide the said external connection between the discharge rails and the ground plane.

3. The electronic component according to claim 1, including a package containing the integrated circuit, and in that the said ground plane comprises a metal plate having one face located outside the package.

4. The electronic component according to claim 3, including separate bonding wires between the integrated circuit and the ground plane, which wires provide the said external connection between the discharge rails and the ground plane.

5. The electronic component according to claim 3, wherein the said metal plate forming the said ground plane is a heat slug placed beneath the integrated circuit.

6. The electronic component according to claim 5, including separate bonding wires between the integrated circuit and the ground plane, which wires provide the said external connection between the discharge rails and the ground plane.

7. The electronic component according to claim 1, further comprising:
a thin metal plate fixed to the integrated circuit, the thin metal plate acting as a ground reference for radiofrequency signals.

8. The electronic component according to claim 7, wherein the ground plane forming a ground reference for electrostatic discharges comprises the thin metal plate.

9. The electronic component according to claim 7, wherein at least one of the several separate functional blocks within the semiconductor substrate comprises a low noise amplifier that is electrically coupled with the thin metal plate acting as a ground reference for radiofrequency signals associated with the low noise amplifier.

10. An electronic device comprising a plurality of electronic components, at least one of the plurality of electronic components comprising:
an integrated circuit incorporating several separate functional blocks within a semiconductor substrate; and
electrostatic discharge protection means, comprising:
several separate metal discharge rails placed above the substrate and respectively associated with the plurality of functional blocks, all the metal discharge rails being mutually unconnected electrically within the integrated circuit but connected electrically via an electrical connection external to the integrated circuit to one and the same ground plane forming a ground reference for electrostatic discharges, the ground plane being located outside the integrated circuit.

11. The electronic device according to claim 10, including separate bonding wires between the integrated circuit and the ground plane, which wires provide the said external connection between the discharge rails and the ground plane.

12. The electronic device according to claim 10, including a package containing the integrated circuit, and in that the said ground plane comprises a metal plate having one face located outside the package.

13. The electronic device according to claim 12, including separate bonding wires between the integrated circuit and the ground plane, which wires provide the said external connection between the discharge rails and the ground plane.

14. The electronic device according to claim 12, wherein the said metal plate forming the said ground plane is a heat slug placed beneath the integrated circuit.

15. The electronic device according to claim 14, including separate bonding wires between the integrated circuit and the ground plane, which wires provide the said external connection between the discharge rails and the ground plane.

16. The electronic device according to claim 10, further comprising:
a thin metal plate fixed to the integrated circuit, the thin metal plate acting as a ground reference for radiofrequency signals.

17. The electronic device according to claim 16, wherein the ground plane forming a ground reference for electrostatic discharges comprises the thin metal plate.

18. The electronic device according to claim 16, wherein at least one of the several separate functional blocks within the semiconductor substrate comprises a low noise amplifier that is electrically coupled with the thin metal plate acting as a ground reference for radiofrequency signals associated with the low noise amplifier.

* * * * *